United States Patent
Liu et al.

(10) Patent No.: US 9,927,707 B2
(45) Date of Patent: Mar. 27, 2018

(54) DEVELOPER FOR LITHOGRAPHY

(71) Applicant: Taiwan Semiconductor Manufacturing Company, Ltd., Hsinchu (TW)

(72) Inventors: Chen-Yu Liu, Kaohsiung (TW); Ching-Yu Chang, Yilang County (TW); Chin-Hsiang Lin, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/470,332

(22) Filed: Mar. 27, 2017

(65) Prior Publication Data
US 2017/0199464 A1    Jul. 13, 2017

Related U.S. Application Data

(63) Continuation-in-part of application No. 14/840,363, filed on Aug. 31, 2015, now Pat. No. 9,612,536.

(51) Int. Cl.
| | |
|---|---|
| G03F 7/32 | (2006.01) |
| G03F 7/039 | (2006.01) |
| H01L 21/027 | (2006.01) |
| G03F 7/09 | (2006.01) |
| G03F 7/20 | (2006.01) |
| G03F 7/38 | (2006.01) |
| C08F 220/18 | (2006.01) |
| C08F 220/26 | (2006.01) |
| C11D 11/00 | (2006.01) |

(52) U.S. Cl.
CPC ............ *G03F 7/322* (2013.01); *C08F 220/18* (2013.01); *C08F 220/26* (2013.01); *C11D 11/0047* (2013.01); *G03F 7/039* (2013.01); *G03F 7/091* (2013.01); *G03F 7/2004* (2013.01); *G03F 7/38* (2013.01); *H01L 21/0274* (2013.01); *H01L 21/0275* (2013.01); *H01L 21/0276* (2013.01)

(58) Field of Classification Search
CPC .......... G03F 7/004; G03F 7/038; G03F 7/039; G03F 7/0045; G03F 7/32; G03F 7/325; G03F 7/40; H01L 21/0275; C08F 220/26; C08F 220/18; C11D 11/0047
USPC .... 430/270.1, 913, 434, 435, 322, 325, 329, 430/330, 331
See application file for complete search history.

(56) References Cited

U.S. PATENT DOCUMENTS

| | | |
|---|---|---|
| 6,599,683 B1 | 7/2003 | Torek et al. |
| 8,216,767 B2 | 7/2012 | Wang et al. |
| 8,323,870 B2 | 12/2012 | Lee et al. |
| 8,512,939 B2 | 8/2013 | Wang et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |

(Continued)

FOREIGN PATENT DOCUMENTS

JP    2013011858    1/2013

*Primary Examiner* — Amanda C Walke
(74) *Attorney, Agent, or Firm* — Haynes and Boone, LLP

(57) ABSTRACT

A method for lithography patterning includes forming a material layer over a substrate; exposing a portion of the material layer to a radiation; and removing the exposed portion of the material layer in a developer, resulting in a patterned material layer. The developer comprises water, an organic solvent, and a basic solute. In an embodiment, the basic solute is less than 30% of the developer by weight.

20 Claims, 7 Drawing Sheets

(56) References Cited

U.S. PATENT DOCUMENTS

| | | |
|---|---|---|
| 8,841,066 B2 | 9/2014 | Wang et al. |
| 9,459,536 B1 | 10/2016 | Lai et al. |
| 9,580,672 B2 | 2/2017 | Liu |
| 2011/0159447 A1 | 6/2011 | Kumagai et al. |
| 2012/0308938 A1 | 12/2012 | Furukawa et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0220495 A1 | 8/2014 | Bozano et al. |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0227051 A1 | 8/2015 | Wang |
| 2015/0309415 A1 | 10/2015 | Bozano et al. |
| 2016/0041465 A1 | 2/2016 | Takizawa et al. |
| 2016/0124310 A1 | 5/2016 | Lilin et al. |

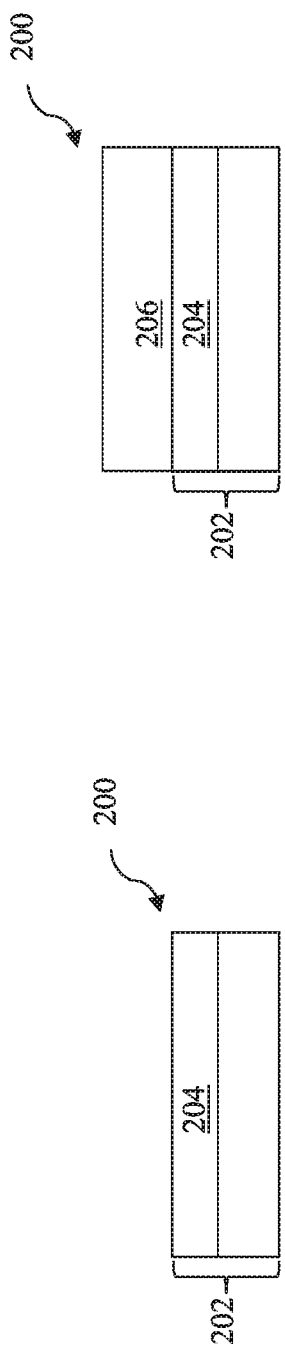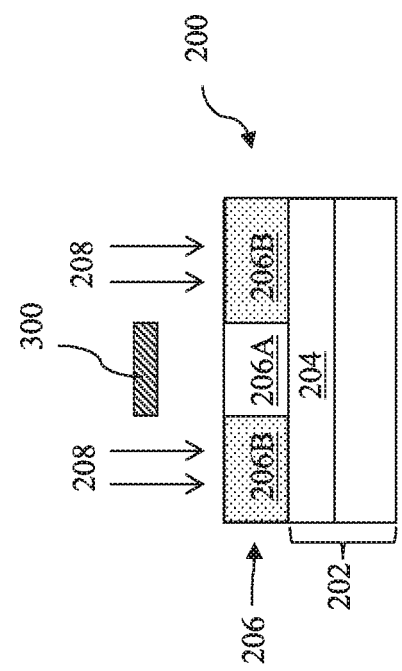

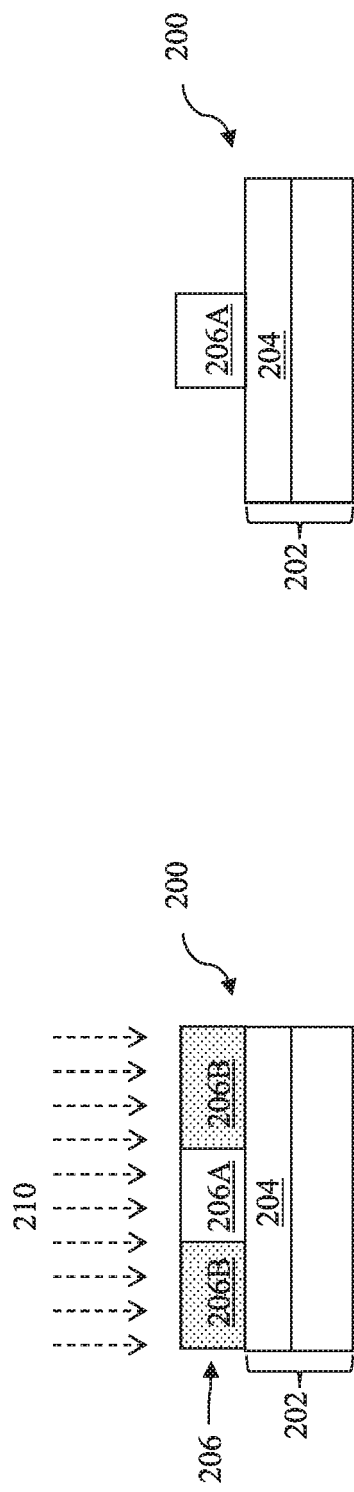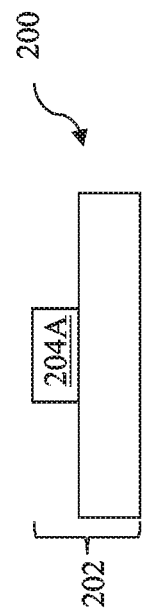

DEVELOPER FOR LITHOGRAPHY

PRIORITY

This is a continuation-in-part application of U.S. patent application Ser. No. 14/840,363, entitled "New Developer for Lithography," filed on Aug. 31, 2015, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, lithography has been the traditional method for transferring IC patterns to a semiconductor wafer. In a typical lithography process, a resist film is coated on a surface of a wafer and is subsequently exposed and developed to form a resist pattern. The resist pattern is then used for etching the wafer to form an IC. The quality of the resist pattern directly impacts the quality of the final IC. As the scaling down process continues, line edge roughness (LER) and line width roughness (LWR) of the resist pattern have become more critical. Multiple factors affect the LER/LWR of a resist pattern, among which is the developer, i.e., the chemical solution used for developing the exposed resist film. Presently, basic aqueous developers are used in positive tone development (PTD) processes, while developers with an organic solvent are used in negative tone development (NTD) processes. The former frequently cause resist swelling issues and resist pattern collapse issues, and the latter does not provide sufficient resist contrast. Accordingly, what is needed is a new type of resist developer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, and 2F illustrate cross-sectional views of forming a target pattern according to the method of FIG. 1, in accordance with an embodiment.

DETAILED DESCRIPTION

Figure 1:
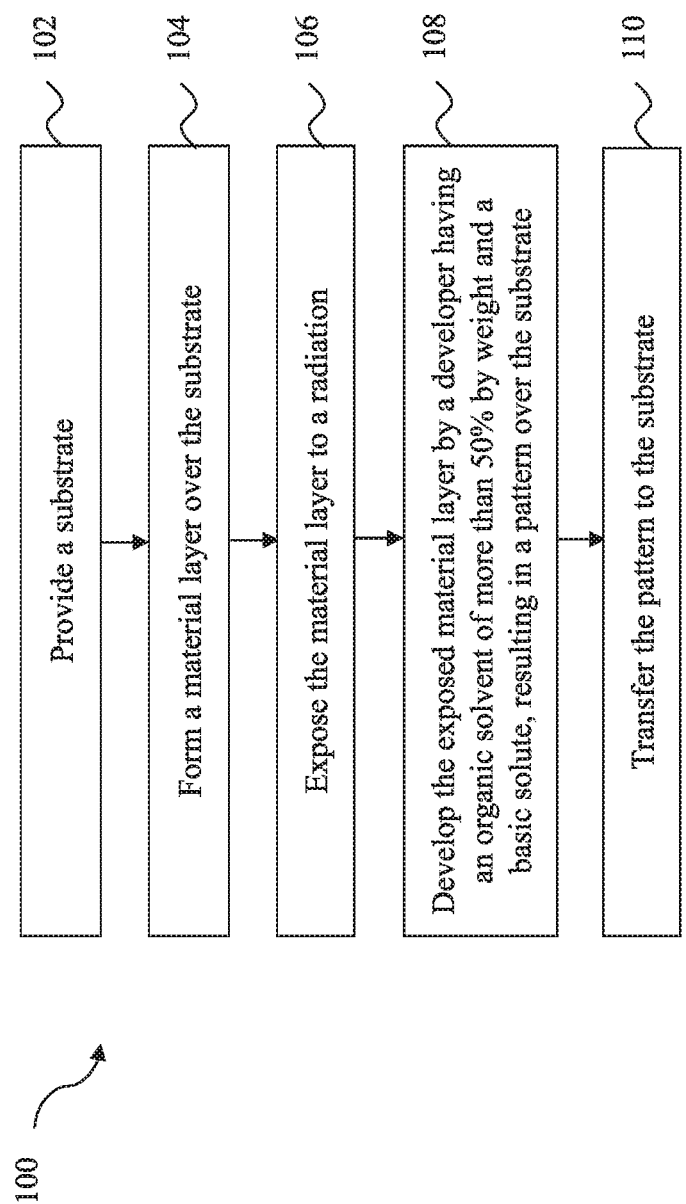
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions for developing exposed resist films in lithography and methods of using the same. In lithography patterning, after a resist film is exposed to a radiation, such as a deep ultraviolet (DUV) ray, an extreme ultraviolet (EUV) ray, or an electron beam (e-beam), it is developed in a developer (a chemical solution). The developer removes portions of the resist film, thereby forming a resist pattern which may include line patterns and/or trench patterns. The resist pattern is then used as an etch mask in subsequent etching processes, transferring the pattern to underlying patterning layers.

There are generally two types of processes for developing exposed resist films: a positive tone development (PTD) process and a negative tone development (NTD) process. The PTD process uses a PTD developer. The NTD process uses a NTD developer. The term "PTD developer" as used herein indicates a developer that selectively dissolves and removes the areas of a resist film that are exposed not lower than a first threshold value (e.g., an exposure dosage value). The term "NTD developer" as used herein indicates a developer that selectively dissolves and removes the areas of a resist film that are unexposed or under-exposed, i.e., the areas exposed not higher than a second threshold value. The first and second threshold values may be the same or different, depending on the parameters of the resist material and the developer. In the following disclosure, the term "unexposed area" of a resist film (or a resist layer) includes both unexposed and under-exposed areas of the resist film.

Presently, commonly used PTD and NTD developers each have their own drawbacks in advanced lithography. For example, commonly used PTD developers frequently cause a resist to swell. It has been observed that exposed areas of a resist film may swell up to or beyond 100% during the PTD process. The resist swelling increases line edge roughness (LER) and line width roughness (LWR) of the developed resist pattern. Another issue with commonly used PTD developers is that the developed resist patterns sometimes collapse due to too much surface tension caused by the PTD developers. The resist swelling issues and resist pattern collapse issues are usually not seen with commonly used NTD developers. However, the NTD developers do not produce as good a resist contrast as the PTD developers do, resulting in high LER, high LWR, and/or low patterning fidelity. An object of the present disclosure is to provide a new and improved PTD developer that can develop a resist film with low LER, low LWR, and high resist contrast. The new developer will meet the demands in today's advanced lithography processes including EUV lithography and e-beam lithography.

Figure 3:
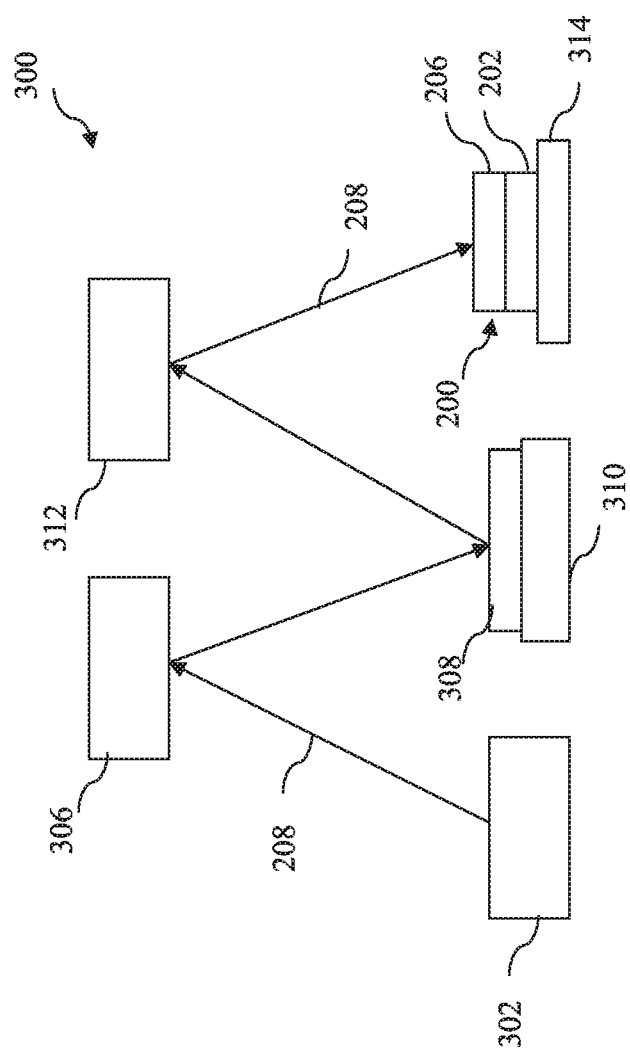
FIGS. 3 and 4 illustrate apparatuses that may be used by the method of FIG. 1, in accordance with some embodiments.
Figure 4:
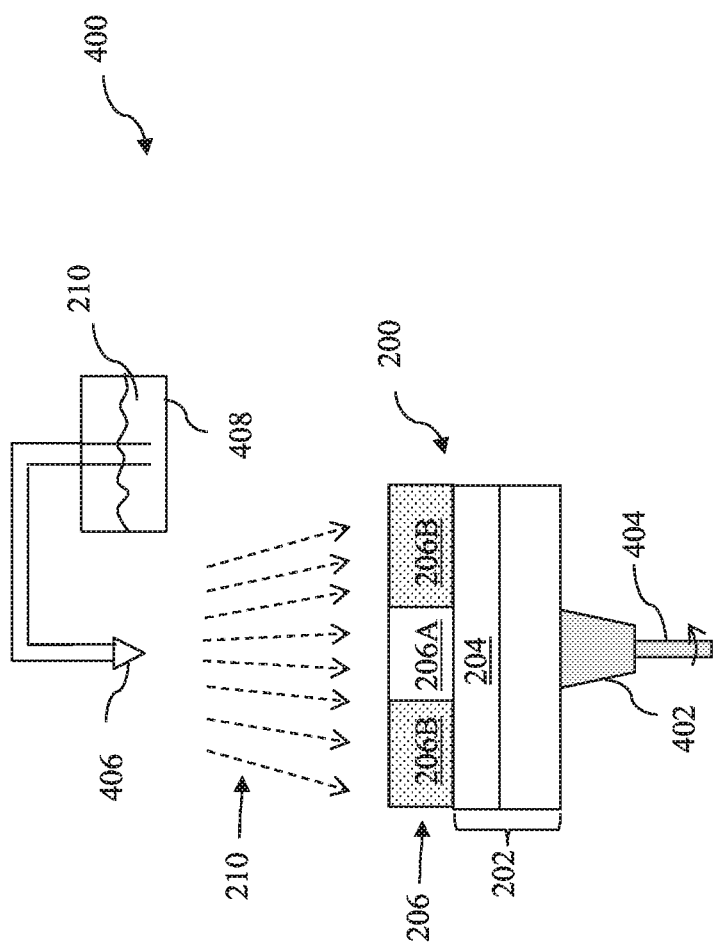

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and other lithography processes. In the present embodiment, EUV lithography is used as the primary example. Additional operations can be provided before, during, and after the method 100, and some operations described can be replaced, eliminated, or moved around for additional embodiments of the method. The method 100 is merely an example, and is not intended to limit the present disclosure beyond what is explicitly recited in the claims. The method 100 is described below in conjunction with FIGS. 2A-2F wherein a semiconductor device 200 is fabricated using embodiments of the method 100. Further, FIGS. 3 and 4 illustrate apparatuses that may be used by the method 100 in some embodiments.

In various embodiments, the semiconductor device 200 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), fin-like FETs (FinFETs), other multi-gate FETs, metal-oxide semiconductor FETs (MOSFET), complementary metal-oxide semiconductor (CMOS) transistors, bipolar transistors, high voltage transistors, high frequency transistors, other active devices, and combinations thereof.

At operation 102, the method 100 (FIG. 1) is provided with a substrate 202. Referring to FIG. 2A, the substrate 202 includes one or more layers of material or composition. In an embodiment, the substrate 202 is a semiconductor substrate (e.g., a wafer). In another embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In another embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

In the present embodiment as shown in FIG. 2A, the substrate 202 includes a patterning layer 204. In an embodiment, the patterning layer 204 is a hard mask layer that includes a material such as amorphous silicon (a-Si), silicon oxide ($SiO_2$), silicon nitride (SiN), silicon oxynitride (SiON), silicon carbon nitride (SiCN), silicon carbide (SiC), titanium nitride (TiN), other suitable materials, or a combination thereof. In various embodiments, the patterning layer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

At operation 104, the method 100 (FIG. 1) forms a material layer 206 over the substrate 202 (FIG. 2B). Referring to FIG. 2B, in an embodiment, the material layer 206 is formed by spin-on coating a liquid polymeric material onto the substrate 202. In an embodiment, the material layer 206 is further treated with a soft baking process and a hard baking process. In an embodiment, the material layer 206 is a radiation sensitive layer, such as a photoresist including an I-line resist, a DUV resist including a krypton fluoride (KrF) resist and argon fluoride (ArF) resist, a EUV resist, an electron beam (e-beam) resist, and an ion beam resist. In the present embodiment, the material layer 206 is a resist sensitive to a EUV radiation and is for PTD development, i.e., its solubility in a PTD developer increases upon EUV radiation. For the sake of convenience, the material layer 206 is simply referred to as the resist film (or resist) 206 in the following discussion. In an embodiment, the resist film 206 contains photo-acid generators (PAGs) which, upon radiation, produce an acid. The acid can catalyze the cleaving of acid labile groups (ALGs) from backbone polymer of the resist film. When the ALGs leave the backbone polymer, the branch unit of the polymer will be changed to carboxylic group. This increases the polymer's solubility to a PTD developer and allows the exposed areas of the resist film to be removed by the developer, while the unexposed areas remain insoluble and become a masking element for subsequent processes.

In an embodiment, prior to the forming of the material layer 206, the method 100 forms an anti-reflective coating (ARC) layer over the patterning layer 204 and then forms the material layer 206 over the ARC layer. For example, the ARC layer may be a nitrogen-free anti-reflective coating (NFARC) layer that includes a material such as silicon oxide ($SiO_2$), silicon oxygen carbide (SOC), plasma enhanced chemical vapor deposited silicon oxide (PECVD-$SiO_2$), other suitable material, or a combination thereof. In yet another embodiment, the method 100 forms more than one layer between the patterning layer 204 and the material layer 206.

At operation 106, the method 100 (FIG. 1) exposes the resist film 206 to a radiation beam 208 in a lithography system 300 (FIG. 2C). Referring to FIG. 2C, the radiation beam 208 may be an I-line (365 nanometers (nm)), a DUV radiation such as KrF excimer laser (248 nm) or ArF excimer laser (193 nm), a EUV radiation (e.g., 13.8 nm), an e-beam, an x-ray, an ion beam, or other suitable radiations. Operation 106 may be performed in air, in a liquid (immersion lithography), or in a vacuum (e.g., for EUV lithography and e-beam lithography). In an embodiment, the radiation beam 208 is patterned with a mask having IC patterns, such as a transmissive mask or a reflective mask, which may include resolution enhancement techniques such as phase-shifting and/or optical proximity correction (OPC). In another embodiment, the radiation beam 208 is directly modulated with IC patterns without using a mask (maskless lithography). In the present embodiment, the radiation beam 208 is a EUV radiation and the lithography system 300 is a EUV lithography system. An embodiment of the EUV lithography system 300 is shown in FIG. 3.

Referring to FIG. 3, the EUV lithography system 300 includes a radiation source 302 that produces the radiation beam 208, condenser optics 306, a mask stage 310 securing a mask 308 thereon, projection optics 312, and a substrate stage 314 securing the device 200 including the substrate 202 and the resist film 206. Other configurations and inclusion or omission of items may be possible. In the present disclosure, the EUV lithography system 300 may be a stepper or a scanner.

The radiation source 302 provides the radiation beam 208 having a wavelength in the EUV range, such as about 1-100 nm. In an embodiment, the radiation beam 208 has a wavelength of about 13.5 nm. The condenser optics 306 includes a multilayer coated collector and a plurality of grazing mirrors. The condenser optics 306 is configured to collect and shape the radiation beam 208 and to provide a slit of the radiation beam 208 to the mask 308. The mask 308, also referred to as a photomask or a reticle, includes patterns of one or more target IC devices. The mask 308 provides a patterned aerial image to the radiation beam 208. The mask 308 is a reflective mask in the present embodiment, and may incorporate resolution enhancement techniques such as phase-shifting techniques and/or optical proximity correction (OPC). The mask stage 310 secures the mask 308 thereon, such as by vacuum, and provides accurate position and movement of the mask 308 during alignment, focus, leveling, and exposure operations in the EUV lithography system 300.

The projection optics 312 includes one or more lens and a plurality of mirrors. The lens may have a magnification of less than one thereby reducing the patterned aerial image of the mask 308 to the device 200, particularly, to the resist film 206. The device 200 is secured by the substrate stage 314 which provides accurate position and movement of the device 200 during alignment, focus, leveling, and exposing operations in the EUV lithography system 300 such that the patterned aerial image of the mask 308 is exposed onto the resist film 206 in a repetitive fashion (though other lithography methods are possible). The exposed portions of the resist film 206 become soluble in a PTD developer.

In the embodiment as shown in FIG. 2C, portions 206B of the resist film 206 are exposed by the radiation 208 with enough dosage such that it can be removed by a PTD developer to be discussed below, while portions 206A of the resist film 206 are the unexposed areas. In an embodiment where the resist film 206 contains PAGs, the semiconductor device 200 may be subjected to one or more post-exposure baking (PEB) processes. The PEB processes typically accelerate the acid production by the PAGs, which in turn accelerate the resist pattern formation process.

At operation 108, the method 100 (FIG. 1) develops the exposed resist film 206 in a developer 210, constructed according to various aspects of the present disclosure. Referring to FIG. 2D, the developer 210 is being applied to the resist film 206, including both the exposed portions 206B and the unexposed portions 206A. In the present embodiment, the developer 210 is a PTD developer that dissolves and removes the exposed portions 206B, resulting a resist pattern 206A (FIG. 2E). In the example as shown in FIG. 2E, the resist pattern 206A is represented by a line pattern. However, the following discussion is equally applicable to resist patterns represented by trenches.

As discussed above, commonly used PTD and NTD developers each have their own drawbacks in today's advanced lithography: the former generally cause resist swelling issues and resist pattern collapse issues, and the latter do not produce enough resist contrast. At the same time, commonly used PTD developers produce high resist contrast and commonly used NTD developers do not cause resist swelling issues. The inventors of the present application have discovered a way of combining the merits of both the PTD and NTD developers while avoiding their respective deficiencies.

Commonly used PTD developers use a basic (or alkaline) aqueous solution, i.e., a solution with water as the solvent and a base as the solute. The base may be organic or inorganic. The inventors of the present application believe that the solvent, water, may be the culprit that causes a resist film to swell. Water has small molecular weight (Mw=18), and small water molecules may easily penetrate a resist film and cause it to expand. Therefore, reducing the water content in a PTD developer may lead to less resist swelling issues.

Commonly used NTD developers use an organic material as the solvent instead of water. The organic solvent has relatively large (compared to water) molecular weight. The inventors of the present application believe that the large molecular weight of the organic solvent is the reason why NTD developers do not usually cause the resist film to swell. However, commonly used NTD developers lack a solute, especially a basic solute, which may be the reason why they do not produce high resist contrast.

The developer 210, constructed according to the present disclosure, combines the merits of the commonly used PTD developers with those of the commonly used NTD developers. In an embodiment, the developer 210 includes at least one organic solvent and at least one basic solute. In a further embodiment, the at least one organic solvent is more than 50% of the developer by weight. More embodiments of the developer 210 are presented below. In various experiments, embodiments of the developer 210 produce resist patterns with smaller LWR and LER than commonly used PTD developers do, and provide much higher resist contrast than commonly used NTD developers do.

In embodiments, the developer 210 contains the basic solute(s) in a range of more than 0% but less than 30% by weight. For example, the developer 210 may contain the basic solute(s) ranging from about 0% to about 20% by weight, such as from about 2% to about 10% by weight.

In embodiments, the developer 210 may further include water that is less 50% of the developer by weight. In one example, the developer 210 contains the organic solvent(s), about 70% by weight; the basic solute(s), about 10% by weight; water, about 20% by weight; and other additives, such as one or more surfactants.

In an embodiment, the organic solvent of the developer 210 contains at least one of: a hydroxyl (OH) functional group, an NH functional group, an $NH_2$ functional group, a sulfhydryl (SH) functional group, a methoxy (OMe) functional group, and an ethoxy (OEt) functional group. In an embodiment, the organic solvent of the developer 210 has a molecular weight less than 300 because having too large a molecular weight may decrease the effectiveness of the developer 210 in dissolving an exposed resist film. However, the molecular weight of the organic solvent is not so small as to cause a resist film to swell like the commonly used PTD developers do. To further this embodiment, the organic solvent has a molecular weight greater than the molecular weight of water. For example, the organic solvent may have a molecular weight greater than 50. In an embodiment, the organic solvent in the developer 210 is one of: ethylene glycol, diethylene glycol, and propylene glycol.

In an embodiment, the basic solute of the developer 210 is an ionic base, a non-ionic base, or a combination thereof. For example, the basic solute may be an ionic base containing $OH^-$ ions. In various embodiments, the basic solute is an ionic base having a molecular weight less than 400 because having too large a molecular weight may decrease the effectiveness of the developer 210 in dissolving an exposed resist film.

In an alternative embodiment, the basic solute may be a non-ionic base, such as a base containing an amine. For example, the basic solute may include a primary amine, a secondary amine, or a tertiary amine. To further this embodiment, the non-ionic base may have a molecular weight less than 300 for the same reason above. In an embodiment, the basic solute is ethylene diamine. In yet another embodiment, the basic solute of the developer 210 is free of metal to avoid metal contents left over in the developed resist. For example, the basic solute may be tetramethylammonium hydroxide (TMAH), tetrabutylammonium hydroxide (TBAH), ethylenediamine (EDA), triethylene amine, pyridine, guanidinium, piperidine, or another organic base.

In various embodiments, the developer 210 has a surface tension less than 50 millinewtons per meter (mN/m). The low surface tension reduces the likelihood of causing resist patterns to collapse. Further, in embodiments, the developer 210 may contain some additives, such as one or more surfactants. For example, the surfactant may be anionic, nonionic, or hydrotropic. The surfactant help reduce the surface tension of the developer 210.

Still referring to FIG. 2D, the developer 210 is applied to the resist film 206. The exposed portions 206B of the resist film 206 are dissolved by the developer 210, leaving the unexposed portions 206A (which include under-exposed portions) over the substrate 202. For the convenience of discussion, the leftover portions 206A are also referred to as the resist pattern 206A. Due to the properties of the developer 210 discussed above, the resist pattern 206A has very smooth edges and sidewalls (i.e., low LER and LWR) and is well defined (i.e., high developing contrast).

In an embodiment, the developer 210 is applied to the device 200 in a developing tool 400, an example of which is shown, in portion, in FIG. 4. Referring to FIG. 4, the developing tool 400 is part of a cluster tool in a semiconductor fabrication process. After the resist film 206 has been exposed in the EUV lithography system 300 (FIGS. 2C and 3), the device 200 is transferred to the developing tool 400 which applies the developer 210 to the resist film 206. In the embodiment as shown in FIG. 4, the developing tool 400 applies the developer 210 in a spin-on developing process, i.e., it sprays the developer 210 onto the resist film 206 while the device 200 is spun about a vertical axis.

As shown in FIG. 4, the developing tool 400 includes a substrate stage 402 designed to secure the device 200 including the resist film 206. The substrate stage 402 is operable to spin such that the device 200 secured thereon is spun accordingly during the spin-on developing process. The substrate stage 402 includes a mechanism, such as vacuum suction, e-chucking, or other suitable mechanism, to secure the device 200. The developing tool 400 further includes a motion mechanism 404 integrated with the substrate stage 402 and is operable to drive the substrate stage 402 and the device 200 secured thereon in various motion modes. In some embodiments, the motion mechanism 404 includes a motor to drive the substrate stage 402 and the device 200 to spin at a certain spin speed during various operations (such as developing and rinsing).

The developer 210 is dispensed through a nozzle 406 over the device 200 while it is spun. The developer 210 is stored in a container 408 and is delivered to the nozzle 406 through a delivery apparatus that includes a pipeline. The developer 210 may be delivered using a pump, a pressurized gas, or other mechanisms.

In various embodiments, the developer 210 can be continuously sprayed onto the device 200. Alternatively, it can be applied by other means such as a puddle developing process. The method 100 may include further operations to finalize the resist pattern 206A after the operation 108. For example, the device 200 may be subjected to a rinsing operation using de-ionized (DI) water to remove residues and particles, and/or a post-development baking (PDB) process to harden the resist pattern 206A so as to increase its structural stability.

At operation 110, the method 100 (FIG. 1) transfers the IC pattern(s) from the resist pattern 206A to the substrate 202 (FIG. 2F). In embodiments, operation 110 includes etching the substrate 202 using the resist pattern 206A as an etch mask. In an embodiment, the patterning layer 204 is a hard mask layer. To further this embodiment, the IC patterns are first transferred from the resist pattern 206A to the hard mask layer 204, then to other layers of the substrate 202. For example, the hard mask layer 204 may be etched through openings of the resist pattern 206A using a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; tetramethylammonium hydroxide (TMAH); a solution containing hydrofluoric acid (HF), nitric acid ($HNO_3$), and/or acetic acid ($CH_3COOH$); or other suitable wet etchant. The resist pattern 206A may be partially or completely consumed during the etching of the hard mask layer 204. In an embodiment, any remaining portion of the resist pattern 206A may be stripped off, leaving a patterned hard mask layer 204A over the substrate 202, as illustrated in FIG. 2F.

Although not shown in FIG. 1, the method 100 may proceed to forming a final pattern or an IC device on the substrate 202. In an embodiment, the substrate 202 is a semiconductor substrate and the method 100 proceeds to forming fin field effect transistor (FinFET) structures. For example, operation 110 may form a plurality of active fins in the semiconductor substrate 202. The active fins have uniform critical dimension (CD), due to the low LER and LWR of the resist pattern 206A. In another embodiment, the method 100 proceeds to forming a plurality of gate electrodes in the semiconductor substrate 202. The gate electrodes have uniform gate length due to the resist pattern 206A's smooth sidewalls. In another embodiment, a target pattern is to be formed as metal lines in a multilayer interconnection structure. For example, the metal lines may be formed in an inter-layer dielectric (ILD) layer of the substrate 202, which has been etched by operation 110 to include a plurality of trenches. The method 100 then proceeds to filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the method 100 and the developer 210 according to various aspects of the present disclosure.

Figure 5:
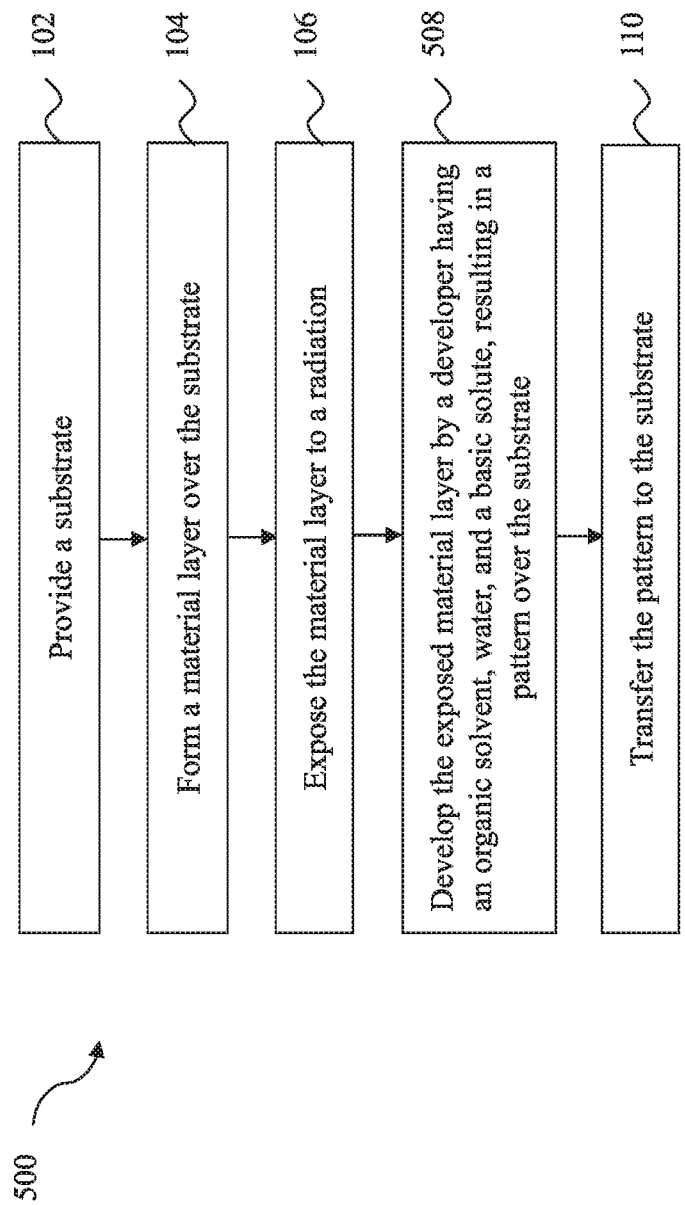
FIG. 5 illustrates a flow chart of another lithography patterning method according to various aspects of the present disclosure.

Referring to FIG. 5, shown therein is a method 500 of patterning a substrate (e.g., a semiconductor wafer) according to various aspects of the present disclosure in some other embodiments. The method 500 is an example, and is not intended to limit the present disclosure beyond what is explicitly recited in the claims. Additional operations can be provided before, during, and after the method 500, and some operations described can be replaced, eliminated, or moved around for additional embodiments of the method. The method 500 is described below in conjunction with FIG. 6 which shows a cross-sectional view of the semiconductor device 200 during a fabrication stage of method 500.

Figure 6:
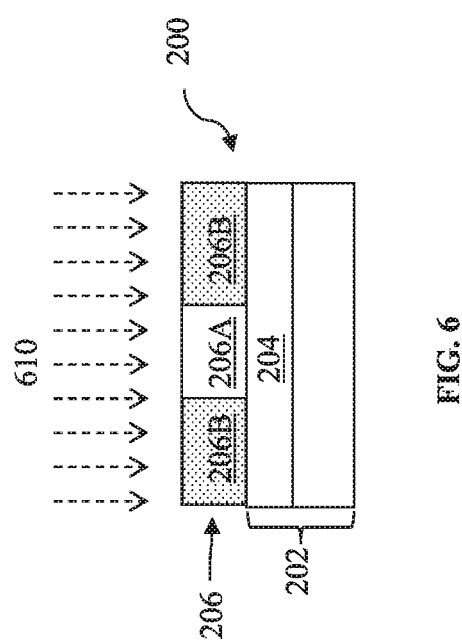
FIG. 6 illustrates a cross-sectional view of forming a target pattern during a fabrication stage according to the method of FIG. 5, in accordance with some embodiments.

The method 500 is similar to the method 100 in many respects. One difference between the method 500 and the method 100 is in the developing of the exposed resist film 206. Referring to FIG. 5, the method 500 also includes the operations 102, 104, 106, and 110 as discussed above in the method 100, which are not repeated herein for the sake of simplicity. From the operation 106, the method 500 proceeds to operation 508 that develops the exposed resist film 206 in a developer 610. Referring to FIG. 6, the developer 610 is being applied to the resist film 206. In some embodiments, the developer 610 includes at least one organic solvent, water, and at least one basic solute. In a further embodiment, the water is more than 20% of the developer by weight. The developer 610, constructed according to the present disclosure, combines the merits of the commonly used PTD developers with those of the commonly used NTD developers due to the similar reasons discussed above in the developer 210. Further, since resist film usually has both hydrophobic components (e.g., resin polymer backbone) and hydrophilic components (e.g., hydroxyl functional group), partial water in the developer 610 can improve dissolving rate of the exposed resist and reduce film loss of the unexposed resist during developing. More embodiments of the developer 610 are presented below. In various experiments, embodiments of the developer 610 produce higher resist dissolving contrast than commonly used PTD and NTD developers do.

In embodiments, the at least one basis solute in the developer 610 is in a range of more than 0% but less than 30% by weight. For example, the developer 610 may contain the basic solute(s) ranging from about 0% to about 20% by weight, such as from about 2% to about 10% by weight. In some embodiments, the developer 610 contains at least one organic solvent that is more than 5% by weight. For example, the developer 610 may contain the organic solvent(s) more than 5% by weight; the basic solute(s), less than 30% by weight; water, more than 20% by weight; and other additives, such as one or more surfactants. In some embodiments, the developer 610 may contain the organic solvent(s) more than 50% by weight. In one example, the developer 610 contains the organic solvent(s), more than 50% by weight; the basic solute(s), less than 30% by weight; water, more than 20% by weight; and other additives, such as one or more surfactants.

In an embodiment, the organic solvent of the developer 610 contains at least one of: a hydroxyl (OH) functional group, an NH functional group, an $NH_2$ functional group, a sulfhydryl (SH) functional group, a methoxy (OMe) functional group, and an ethoxy (OEt) functional group. In an alternative embodiment, the organic solvent of the developer 610 contains a $RO(CH_2)_nOR$ functional group with n as an integer≥2. In one example, n=2 or 3. Each R can be the same or different, selected from a group of a hydrogen atom and an alkyl with less than 10 carbon atoms. In an embodiment, the organic solvent of the developer 610 is one of: ethylene glycol, diethylene glycol, and propylene glycol. In an embodiment, the organic solvent of the developer 610 has a molecular weight less than 500. The molecular weight of the organic solvent is greater than the molecular weight of water to reduce resist film swelling.

In an embodiment, the basic solute of the developer 610 is an ionic base, a non-ionic base, or a combination thereof. For example, the basic solute may be an ionic base containing $OH^-$ ions. The ionic base may have a molecular weight less than 400. In an alternative embodiment, the basic solute may be a non-ionic base, such as a base containing an amine. For example, the basic solute may include a primary amine, a secondary amine, or a tertiary amine. The non-ionic base may have a molecular weight less than 300. For example, the basic solute may be tetramethylammonium hydroxide (TMAH), tetrabutylammonium hydroxide (TBAH), ethylenediamine (EDA), triethylene amine, pyridine, guanidinium, piperidine, or another organic base. In an embodiment, the basic solute of the developer 610 is free of metal to avoid metal contents left over in the developed resist.

In various embodiments, the developer 610 has a surface tension less than 50 millinewtons per meter (mN/m). The low surface tension reduces the likelihood of causing resist patterns to collapse. Further, in some embodiments, the developer 610 may contain additives, such as one or more surfactants to help reduce the surface tension of the developer 610. For example, the surfactant may be anionic, nonionic, or hydrotropic.

Still referring to FIG. 6, the developer 610 is applied to the resist film 206. The exposed portions 206B of the resist film 206 are dissolved by the developer 610, resulting a resist pattern 206A (FIG. 2E). In the example as shown in FIG. 2E, the resist pattern 206A is represented by a line pattern. But the method 500 is equally applicable to resist patterns represented by trenches. Due to the properties of the developer 610 discussed above, the resist pattern 206A has low LER, low LWR, and high resist contrast. Referring back to FIG. 5, from the operation 508, the method 500 proceeds to operation 110 that transfers the IC pattern(s) from the resist pattern 206A to the substrate 202 (FIG. 2F), which is similar to what has been described in the method 100 and not repeated herein for the sake of simplicity.

Although not intended to be limiting, one or more embodiments of the present disclosure provide many benefits to a semiconductor device and the formation thereof. For example, a resist developer constructed according to the present disclosure provides superior performance in PTD processes for advanced lithography, such as DUV lithography, EUV lithography, and e-beam lithography. The resist developer leads to reduced resist pattern surface roughness such as LER and LWR, and provides high patterning fidelity. The provided resist developer is advantageous in nanometer semiconductor fabrication where CD uniformity has become a critical factor in circuit performance.

In one exemplary aspect, the present disclosure is directed to a method for lithography patterning. The method includes forming a material layer over a substrate, and exposing a portion of the material layer to a radiation. The method further includes removing the exposed portion of the material layer in a developer, resulting in a patterned material layer, wherein the developer comprises water, an organic solvent, and a basic solute.

In another exemplary aspect, the present disclosure is directed to a method for lithography patterning. The method includes forming a resist layer over a substrate, exposing a portion of the resist layer to a radiation, and removing the exposed portion of the resist layer in a developer, resulting in a patterned resist layer. The developer comprises a basic solute, less than 30% of the developer by weight; water, more than 20% of the developer by weight; and an organic solvent, more than 5% of the developer by weight.

In another exemplary aspect, the present disclosure is directed to a method for lithography patterning. The method includes forming a material layer over a substrate, and exposing a portion of the material layer to a radiation. The method further includes removing the exposed portion of the material layer in a positive tone developer, resulting in a patterned material layer, wherein the positive tone developer comprises an organic solvent and a basic solute.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   forming a material layer over a substrate;
   exposing a portion of the material layer to a radiation; and
   removing the exposed portion of the material layer in a positive tone developer, resulting in a patterned material layer, wherein the positive tone developer comprises water, an organic solvent and a basic solute.

2. The method of claim 1, wherein the basic solute is less than 30% of the developer by weight.

3. The method of claim 1, wherein the water is more than 20% of the developer by weight.

4. The method of claim 1, wherein the organic solvent includes one of: an OH functional group, an NH functional group, an $NH_2$ functional group, an SH functional group, an OMe functional group, and an OEt functional group.

5. The method of claim 1, wherein the organic solvent includes a $RO(CH_2)_nOR$ functional group, and wherein n is an integer $\geq 2$.

6. The method of claim 5, wherein R is one of: a hydrogen atom and an alkyl with less than 10 carbon atoms.

7. The method of claim 1, wherein the organic solvent has a molecular weight (Mw) less than 500.

8. The method of claim 7, wherein the organic solvent is one of: ethylene glycol, diethylene glycol, and propylene glycol.

9. The method of claim 1, wherein the basic solute is: an ionic base, a non-ionic base, or a combination thereof.

10. The method of claim 1, wherein the basic solute is an ionic base having a molecular weight (Mw) less than 400.

11. The method of claim 1, wherein the basic solute is a non-ionic base containing an amine.

12. The method of claim 11, wherein the amine is a primary amine, a secondary amine, or a tertiary amine.

13. The method of claim 1, wherein the basic solute is a non-ionic base having a molecular weight (Mw) less than 300.

14. A method for lithography patterning, comprising:
   forming a resist layer over a substrate;
   exposing a portion of the resist layer to a radiation; and
   removing the exposed portion of the resist layer in a positive tone developer, resulting in a patterned resist layer, wherein the positive tone developer comprises:
   a basic solute, less than 30% of the developer by weight;
   water, more than 20% of the developer by weight; and
   an organic solvent, more than 5% of the developer by weight.

15. The method of claim 14, wherein the organic solvent is more than 50% of the developer by weight.

16. The method of claim 14, wherein the basic solute is an ionic base containing $OH^-$ ions, the ionic base having a molecular weight (Mw) less than 400.

17. The method of claim 14, wherein the developer further comprises a surfactant.

18. A method for lithography patterning, comprising:
   forming a material layer over a substrate;
   exposing a portion of the material layer to a radiation; and
   removing the exposed portion of the material layer in a positive tone developer, resulting in a patterned material layer, wherein the positive tone developer comprises an organic solvent and a basic solute.

19. The method of claim 18, wherein the positive tone developer further comprises water that is more than 20% of the positive tone developer by weight, and wherein the basic solute is less than 30% of the positive tone developer by weight.

20. The method of claim 18, wherein:
   the positive tone developer has a surface tension less than 50 millinewtons per meter (mN/m).

* * * * *